(12) United States Patent
Johnson et al.

(10) Patent No.: US 9,379,676 B2
(45) Date of Patent: Jun. 28, 2016

(54) CIRCUITRY AND METHODS FOR COMMON-MODE REJECTION CALIBRATION

(71) Applicant: Silicon Laboratories Inc., Austin, TX (US)

(72) Inventors: Michael S. Johnson, Austin, TX (US); Russell Croman, Buda, TX (US)

(73) Assignee: Silicon Laboratories Inc., Austin, TX (US)

( * ) Notice: Subject to any disclaimer, the term of this patent is extended or adjusted under 35 U.S.C. 154(b) by 93 days.

(21) Appl. No.: 14/166,370

(22) Filed: Jan. 28, 2014

(65) Prior Publication Data
US 2015/0214911 A1    Jul. 30, 2015

(51) Int. Cl.
*H03F 1/56* (2006.01)
*H03F 1/02* (2006.01)
*H03F 3/45* (2006.01)

(52) U.S. Cl.
CPC ............. *H03F 1/56* (2013.01); *H03F 3/45941* (2013.01); *H03F 3/45977* (2013.01); *H03F 3/45995* (2013.01); *H03F 2203/45048* (2013.01); *H03F 2203/45078* (2013.01); *H03F 2203/45082* (2013.01); *H03F 2203/45171* (2013.01); *H03F 2203/45522* (2013.01); *H03F 2203/45538* (2013.01); *H03F 2203/45576* (2013.01); *H03F2203/45591* (2013.01); *H03F 2203/45616* (2013.01)

(58) Field of Classification Search
CPC .................. H03F 1/3247; H03F 3/211; H03F 2201/3233; H03F 3/45085; H03F 1/3211; H03F 3/45071; H03F 3/45659; H03F 3/45183; H03F 3/45475; H03G 1/0023; H03G 1/0088; H03G 3/45183; H03G 3/3042

USPC ............. 330/2, 69, 144, 149, 199, 252–254, 330/257, 258, 260, 284, 285, 296, 9; 455/570

See application file for complete search history.

(56) References Cited

U.S. PATENT DOCUMENTS

| | | | |
|---|---|---|---|
| 6,590,436 B2 * | 7/2003 | Jordanger et al. | 327/333 |
| 6,985,021 B1 * | 1/2006 | Zaliznyak et al. | 327/333 |
| 7,466,249 B2 * | 12/2008 | Chen | 341/118 |
| 7,696,824 B2 | 4/2010 | Mate | |
| 7,978,863 B2 | 7/2011 | Kuiri | |

OTHER PUBLICATIONS

Karki, "Fully Differential Amplifiers Remove Noise From Common-Mode Signals", EDN, Nov. 9, 2000, 5 pgs.

* cited by examiner

*Primary Examiner* — Steven J Mottola
*Assistant Examiner* — Hafizur Rahman
(74) *Attorney, Agent, or Firm* — Egan, Peterman, Enders & Huston LLP (57) ABSTRACT

Circuitry and methods are disclosed that may employ common mode calibration circuitry configured to at least partially calibrate out impedance differences or mismatches between the differential signal paths of differential signal circuitry. The common mode calibration circuitry may be integrated as an internal part of integrated differential signal circuitry that includes a differential amplifier to reject common mode noise, and may be used to reduce or substantially eliminate any external and/or internal difference in signal path resistance that exists between the differential signal paths of the integrated differential signal circuitry. A common mode calibration signal may be internally or externally applied to the signal inputs of differential signal circuitry, and used to determine a setting for the common mode calibration circuitry that at least partially calibrates out impedance differences or mismatches between the differential signal paths of differential signal circuitry.

26 Claims, 5 Drawing Sheets

CIRCUITRY AND METHODS FOR COMMON-MODE REJECTION CALIBRATION

FIELD OF THE INVENTION

This disclosure generally relates to common-mode rejection, and more particularly to circuitry for calibration of common mode rejection.

BACKGROUND OF THE INVENTION

Electrically noisy environments such as automobiles, factories, or other locations with large amounts of equipment in operation, typically use differential amplifiers to reject noise that couples onto both the positive and negative leads of an analog input. The noise, common to both the positive and negative input leads, is rejected by a differential amplifier.

Figure 1:
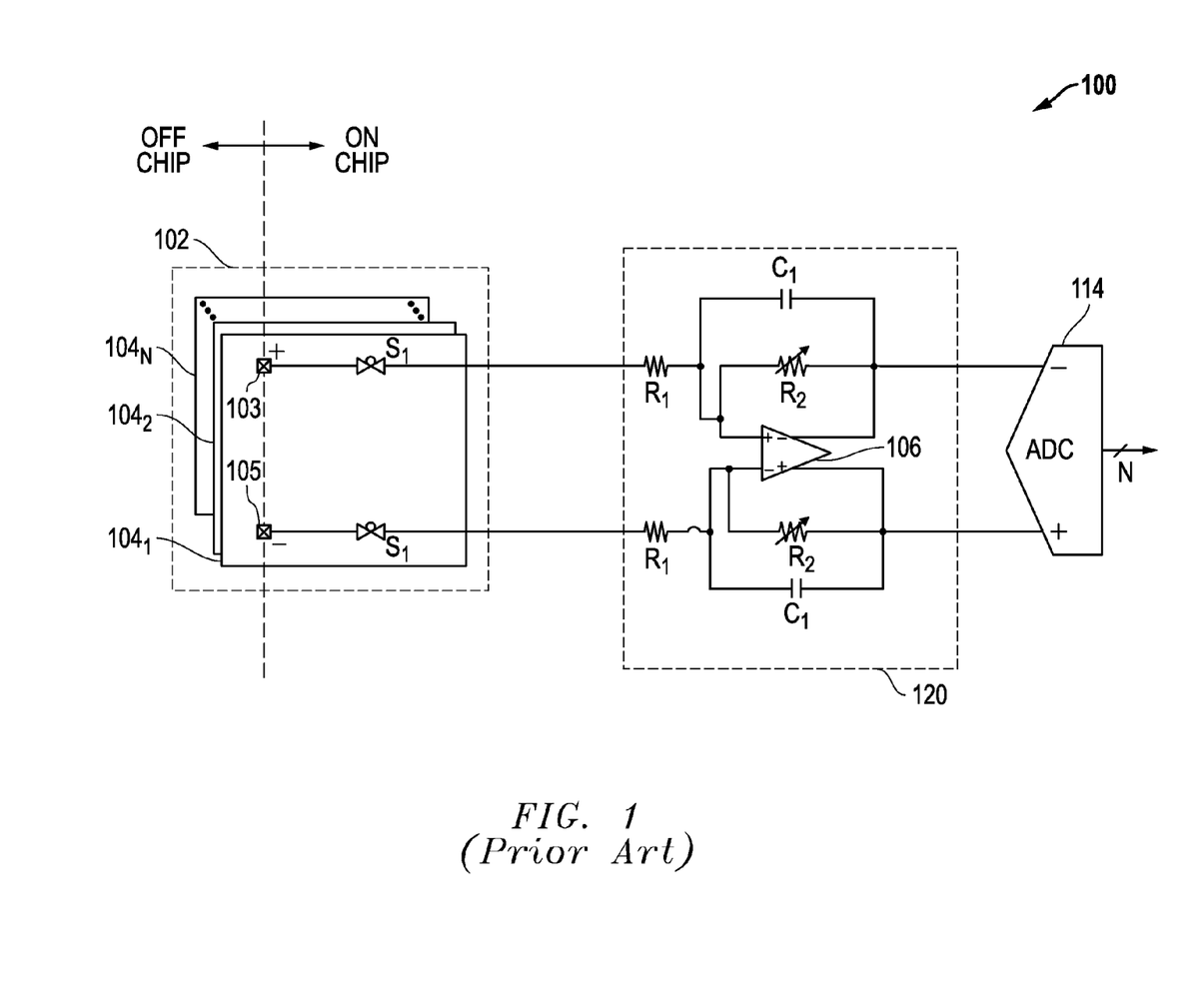
FIG. 1 illustrates conventional integrated analog audio front end circuitry.

FIG. 1 illustrates conventional integrated analog audio front end circuitry 100 that includes differential programmable gain amplifier (PGA) circuitry 120 which rejects common mode noise and that is coupled to receive positive and negative input signals from multiplexer circuitry 102 and to provide positive and negative output signals to analog to digital converter (ADC) 114. Multiplexer circuitry 102 is present to select among multiple analog differential audio input source pairs $104_1$ to $104_N$, each of which includes respective positive and negative signal input pads 103 and 105 that provide a respective input for positive and negative signal lines of a given analog audio source. As shown, multiplexer circuitry 102 includes input multiplexer switching elements $S_1$ that are provided for selectively and separately coupling each individual differential source 104 one at a time to the differential programmable gain amplifier 120 as shown.

As further shown in FIG. 1, each of positive and negative input signal lines of the differential programmable gain amplifier 120 includes a respective input resistor $R_1$ that is coupled to gain control circuit components and differential amplifier 106 of circuitry 120. Gain control circuit components include variable resistors $R_2$ that may be selectively coupled in parallel within a respective signal line in response to a control signal provided by a microcontroller (not shown).

Any resistive mismatches between the positive and negative signal paths of analog audio front end circuitry 100 that are present in external or internal integrated circuitry components will degrade the ability of differential PGA circuitry 120 to reject common-mode noise. In the past, permanently trimmable components, such as resistors or fuses, have been provided in each of the positive and negative signal paths of such circuitry, and laser trimming or fuse trimming was used to correct for integrated resistive mismatches.

SUMMARY OF THE INVENTION

Disclosed herein are circuitry and methods that may employ common mode calibration circuitry configured to at least partially calibrate out (i.e., reduce or substantially eliminate) impedance differences or mismatches between the differential signal paths of differential signal circuitry. Advantageously, the disclosed common mode calibration circuitry may be adjustable and readjustable in real time to at least partially calibrate and recalibrate out any impedance mismatches (e.g., such as due to resistive, capacitive, and/or inductive mismatches) between the differential signal paths of differential signal circuitry as conditions and/or impedance mismatches change, e.g., such as when external source of a differential signal changes, gain changes, and/or when the differential signal circuitry is powered down and then powered up again.

In one embodiment, common mode calibration circuitry may be integrated as an internal part of integrated differential signal circuitry e.g., such as integrated analog signal front end circuitry that employs a differential amplifier to reject common mode noise. In such an integrated configuration, any external and/or internal difference in signal path impedance between the differential signal paths of integrated differential signal circuitry may be internally reduced or substantially eliminated by applying an internal or external common mode calibration signal to the differential signal paths, while at the same time controlling variable impedance circuit elements of the integrated common mode calibration circuitry within at least one of the signal paths of the differential signal circuitry to calibrate out any impedance difference or mismatch between the signal path pair that manifests itself as a DC value at the output of the differential amplifier while the calibration signal is applied. The disclosed circuitry and methods may be particularly useful when implemented with other circuitry for digitization of analog signals received in an electrically noisy environment, such as automobiles, factories, etc. Moreover, unlike conventional permanently trimmable resistors or fuses, variable impedance elements of the disclosed common mode calibration circuitry may be temporarily adjusted and then later readjusted in one or both of the positive or negative signal paths as conditions or signal inputs change, e.g., to allow impedance to be increased and then later decreased in a given signal path, or vice versa, as with a change in signal inputs.

Advantageously, in one embodiment integrated variable impedance elements (e.g., such as variable resistance elements, variable capacitance elements, variable inductance elements, etc.) that are integrated within a differential signal circuit may be automatically controlled to initially calibrate out and/or later re-calibrate out differences in signal path impedance between a pair of analog differential signal paths as circuit configurations or other conditions change, e.g., as external input signal sources to the integrated circuit are changed over time. In this regard, any external and/or internal differences in signal path impedance between differential signal paths may be automatically and internally calibrated out using integrated variable impedance elements (e.g., such as variable resistance elements, variable capacitance elements, variable inductance elements, etc.) based at least in part on an external common mode reference or calibration signal that is applied to a pair of differential signal inputs of the integrated circuit. In another exemplary embodiment, an integrated common mode calibration signal source may be provided to supply an internal common mode calibration signal to internal differential signal paths of an integrated differential signal circuit, and any internal differences in signal path impedance between differential signal paths may be automatically and internally calibrated out using integrated variable impedance elements based at least in part this internal common mode calibration signal. Thus, the disclosed circuits and methods may be implemented in one exemplary embodiment in a low cost manner to improve the common-mode rejection ratio of an integrated circuit, and in another exemplary embodiment to provide a simple, integrated, and automatic method to calibrate out external differences in signal path impedance.

In one exemplary embodiment, more than one type of impedance mismatch may be at least partially calibrated out using sequential calibration operations, e.g., by first applying a common mode calibration signal and adjusting variable resistive elements to at least partially calibrate out any resistive mismatches, and then applying a common mode sine wave calibration signal and adjusting variable capacitive elements to at least partially calibrate out any capacitive mismatches.

In one respect, disclosed herein is differential signal circuitry having at least one differential input source configured to receive positive and negative signal components of an analog differential signal pair. The differential circuitry may include: a differential amplifier having a positive input coupled to receive the positive signal of the analog differential signal pair across a positive signal path from the differential input source, and a negative input coupled to receive the negative signal of the analog differential signal pair across a negative signal path from the differential input source; and common mode calibration circuitry coupled within at least one of the positive signal path or negative signal path between the differential input source and the inputs of the differential amplifier, the common mode calibration circuitry being configured to programmably vary the impedance of at least one of the positive signal path or negative signal path to reduce any difference in signal path impedance between the positive and negative signal paths.

In another respect, disclosed herein is a method of calibrating positive and negative signal paths of differential signal circuitry that includes a differential amplifier having a positive input coupled to receive a positive signal of an analog differential signal pair across a positive signal path from a differential input source, and that has a negative input coupled to receive a negative signal of the analog differential signal pair across a negative signal path from the differential input source. The method may include using common mode calibration circuitry to programmably vary the impedance of at least one of the positive signal path or negative signal path to reduce any difference in signal path impedance between the positive and negative signal paths.

DESCRIPTION OF ILLUSTRATIVE EMBODIMENTS

Figure 2:
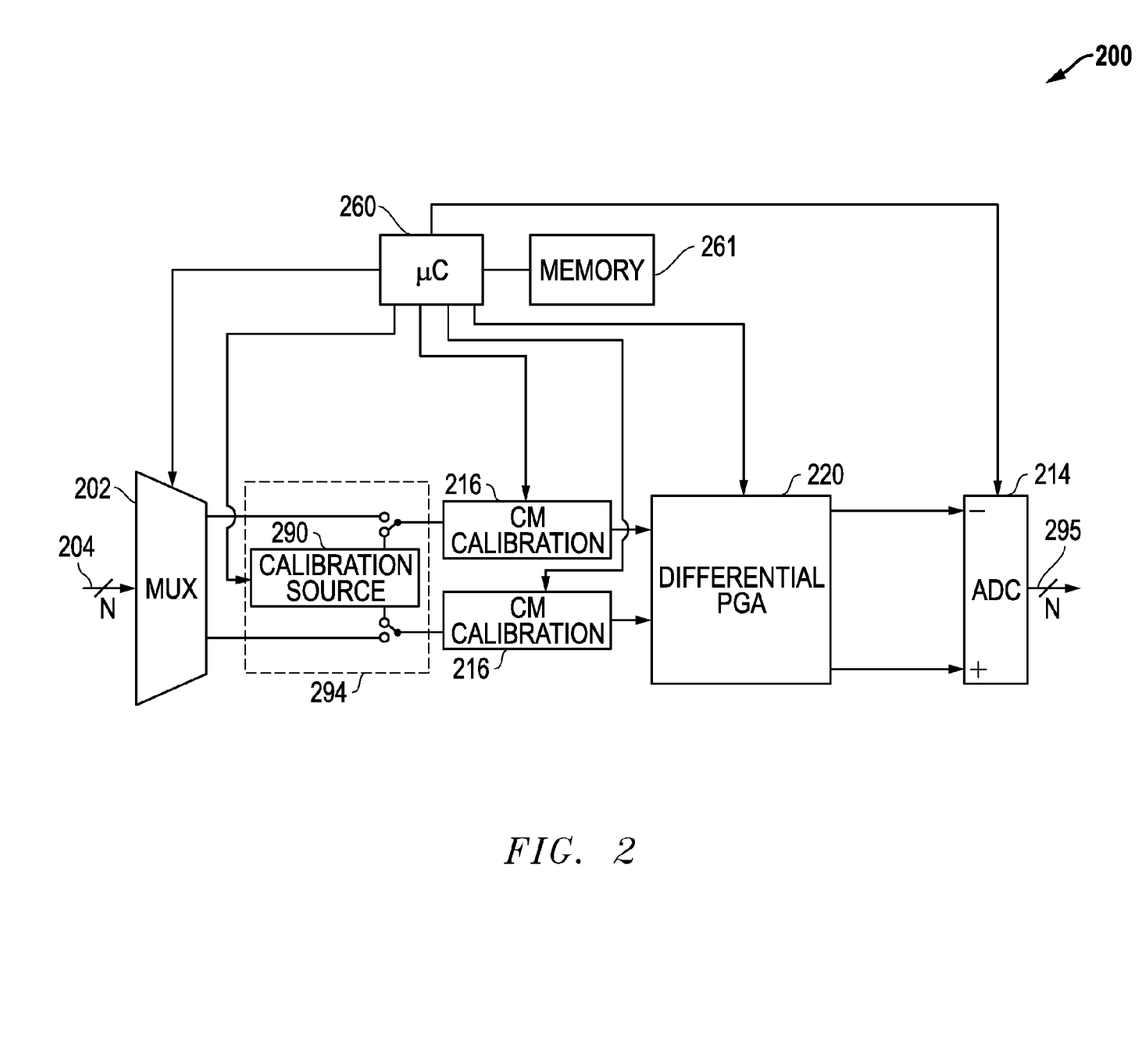
FIG. 2 illustrates a block diagram of differential signal circuitry according one exemplary embodiment of the disclosed circuitry and methods.

FIG. 2 illustrates a block diagram of differential signal circuitry 200 as it may be configured according one embodiment of the disclosed circuitry and methods. In one exemplary embodiment, circuitry 200 may be integrated analog audio front end circuitry, such as may be an integrated part of automotive radio tuner and/or amplifier circuitry. However, it will be understood that the disclosed circuitry and methods may be implemented with other types of differential signal circuitry, e.g., such as circuitry configured to receive analog data signals from electronic sensors or other instrumentation or circuitry (e.g., such as dynamic signal analyzers, industrial control loops, geophones, downhole well logging tools, avionics, etc.), circuitry for receiving analog audio signals from microphones, accelerometers or other sources, etc. In one embodiment described further herein in relation to FIG. 3, all components of differential signal circuitry 200 may be integrated on a single semiconductor chip. However, in other embodiments separate components of differential signal circuitry 200 may be partitioned between multiple semiconductor chips or implemented using other separate (e.g., external) and/or discrete circuitry configurations.

As shown in FIG. 2, circuitry 200 includes differential programmable gain amplifier (PGA) circuitry 220 that is coupled to receive positive and negative input signals from multiplexer circuitry 202 and to provide positive and negative output signals to analog to digital converter (ADC) 214, which in turn produces digital output signals 295 for further processing by other circuitry. Differential PGA circuitry 220 may include gain control circuitry components as will be described further herein. It will be understood that although differential signal circuitry 200 includes multiplexer circuitry 202 in this embodiment, in other embodiments multiplexer circuitry 202 may be implemented using external or off-chip circuitry, and in yet other embodiments no multiplexer circuitry is required to be present. Moreover, it is not necessary that differential PGA circuitry 220 output differential signals directly to an ADC 214 as shown, but rather other circuitry may be coupled to receive differential signals that are output by differential PGA circuitry 220.

Still referring to FIG. 2, readjustable and programmable common mode calibration circuitry 216 is coupled between multiplexer circuitry 202 and differential PGA circuitry 220 in each of positive and negative (+ and −) signal paths of differential signal circuitry 200. As will be described further below, common mode calibration circuitry 216 may be controlled in real time (e.g., by an integrated on-chip microcontroller 260 or by one or more other suitable internal or external processing device and/or other control circuitry) to programmably (e.g., temporarily and selectively) tune or otherwise vary the resistance and/or other impedance value (e.g., such as capacitance) in each of positive and/or negative signal paths relative to each other in order to calibrate out any difference (mismatch) in signal path resistance and/or other type of impedance difference between the positive and negative signal paths, e.g., such that the electrical circuit resistance and/or other type of electrical circuit impedance of each of the positive and negative signal paths between the location of an injected internal or external common mode calibration signal and differential differential PGA circuitry 220 is substantially the same. Examples of signal path imbalances that may cause such resistive mismatches include, but are not limited to, series resistor/s provided in only one of the positive or negative signal paths, mismatched resistors in the positive and negative signal paths, parallel sections of positive and negative signal paths having different length relative to each other, etc.

Additionally, optional internal common mode calibration signal circuitry 294 may be provided as shown in the input signal path between multiplexer 202 and differential PGA circuitry 220. Such internal common mode calibration signal circuitry 294 may be controlled (e.g., by microcontroller 260 or other suitable processing device) to selectively provide a common mode calibration signal on each of the internal positive and negative signal paths to differential PGA circuitry 220 while at the same time controlling common mode calibration circuitry 216 to programmably (e.g., temporarily and selectively) vary the signal path resistance of at least one of the positive and/or negative signal paths relative to each other in order to calibrate out any difference in signal path resistance between the positive and negative signal paths. In this regard, common mode calibration circuitry 216 may be controlled to programmably vary the difference in signal path resistance between the positive and/or negative signal paths relative to each other until the resulting DC signal value measured at the output of differential amplifier 206 (e.g., by ADC 214) is minimized, e.g., until the signal path resistance of each of the positive and negative internal signal paths is substantially the same. In another embodiment, internal common mode calibration signal circuitry 294 may be controlled (e.g., by microcontroller 260 or other suitable processing device) to selectively provide a common mode calibration signal in the form of a sinusoidal wave on each of the internal positive and negative signal paths to differential PGA circuitry 220 while at the same time controlling common mode calibration circuitry 216 to programmably vary the difference in signal path capacitance between the positive and/or negative signal paths relative to each other until the resulting DC signal value measured at the output of differential amplifier 206 (e.g., by ADC 214) is minimized.

Also shown in FIG. 2 is storage memory 261 (e.g., non-volatile and/or volatile memory device/s) that are coupled to microcontroller 260 to allow storage and retrieval of calibration codes or values by microcontroller 260 for operation of differential signal circuitry 200 for different circuit states (e.g., PGA 220 gains, different selected inputs of 204 via 202, control of common mode calibration signal circuitry 294, etc.).

Figure 3:
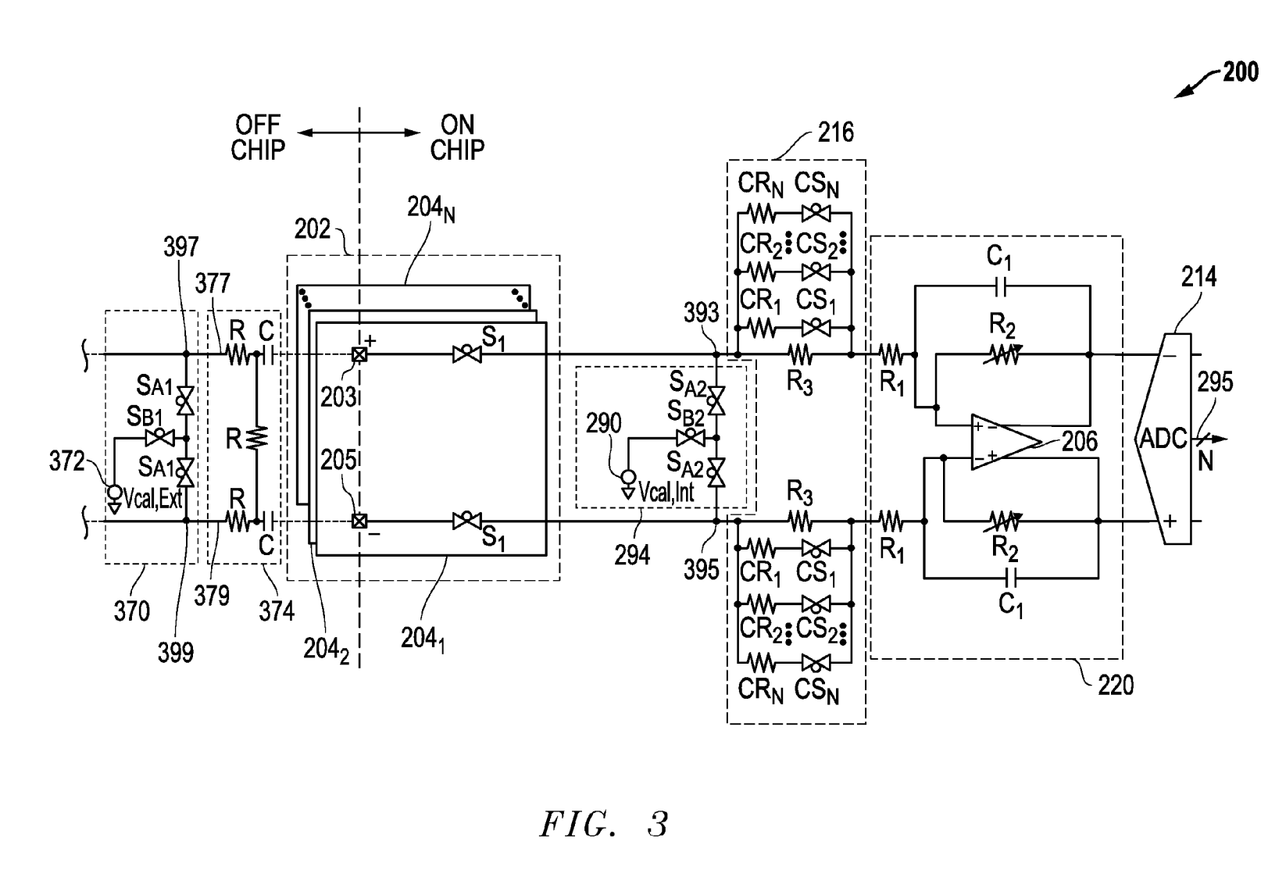
FIG. 3 illustrates integrated differential signal circuitry according to one exemplary embodiment of the disclosed circuitry and methods.

FIG. 3 illustrates one exemplary of differential signal circuitry 200 as it may be integrated on a single semiconductor chip, it being understood that other suitable circuit configurations may be alternatively employed. As shown in FIG. 3, multiplexer circuitry 202 is present to select among multiple analog differential audio input source pairs $204_1$ to $204_N$, such as balanced audio signal input pairs that each include positive and negative signal lines from a different analog audio source such as a portable MP3 player, an external CD player, a smart phone, etc. In this regard, each of input sources 204 may include respective positive and negative signal input pads 203 and 205 that provide a respective input for positive and negative signal lines of a given differential analog audio source. In this exemplary embodiment, multiplexer circuitry 202 includes input multiplexer switching elements $S_1$ that are provided for selectively and separately coupling each individual differential source 204 one at a time in signal communication with differential PGA circuitry 220 as shown. Switching elements $S_1$ of multiplexer circuitry 202 may be controlled in any suitable manner in response to user or system selection, e.g., by micro-controller 260 or other suitable processing device/s or control circuitry as illustrated and described in relation to FIG. 2.

As further shown in FIG. 3, each of positive and negative input signal lines of differential PGA circuitry 220 includes a respective input resistor $R_1$ that is coupled to gain control circuit components and differential amplifier 206 of circuitry 220. Gain control circuit components include variable resistors $R_2$ that are each configured to be selectively coupled in parallel with capacitor $C_1$ and differential amplifier 206. In this regard, each of series variable resistors $R_2$ may be controlled and selectively coupled into a respective signal line in response to a control signal, e.g., provided by microcontroller 260 of FIG. 2. It will be understood that gain control circuitry may alternatively be implemented or integrated within differential amplifier 206.

Also shown in FIG. 3 is integrated common mode calibration circuitry 216 coupled between integrated multiplexer circuitry 202 and integrated differential PGA circuitry 220 in each of positive and negative signal paths of differential signal circuitry 200. In this exemplary embodiment, common mode calibration circuitry 216 includes a fixed series resistive element $R_3$ and multiple selectable parallel resistive elements $CR_1$ to $CR_N$ that are each paired with corresponding respective switching elements $CS_1$ to $CS_N$ in each of positive and negative signal paths of differential signal circuitry 200.

In the illustrated configuration, each of resistive elements $CR_1$ to $CR_N$ may be individually and selectively inserted within one of the positive and negative signal paths by closing its corresponding paired switching element $CS_1$ to $S_N$ such that it is coupled in parallel with the fixed resistive element $R_3$ within of the respective signal path in a manner that alters the electrical resistance of the internal signal path. Similarly, each of resistive elements $CR_1$ to $CR_N$ may be individually and selectively removed from one of the positive and negative signal paths by opening its corresponding paired switching element $CS_1$ to $CS_N$ such that it is not coupled in parallel within the respective signal path to further alter the electrical resistance of the corresponding internal signal path. In this way, various combinations of resistive elements may be selectively inserted into one or both of the internal positive and/or negative signal paths of differential signal circuitry 200 to programmably vary and tune the signal path resistance of each of positive and/or negative signal paths relative to each other in order to substantially equalize the signal path resistance of the signal paths relative to each other e.g., to reduce or substantially eliminate any resistive mismatch between the positive and negative signal paths such that the total signal path resistance in each of the positive and negative signal paths between the point of application of an internal or external calibration signal and ADC 214 is substantially the same. In one embodiment, each of the switching elements $CS_1$ to $CS_N$ of positive and negative signal paths may be selectively and individually opened and closed under the control of microcontroller 260 or other suitable processing device.

Although FIG. 3 illustrates and is described with reference to a variable resistance embodiment of common mode calibration circuitry 216 that includes multiple selectable parallel resistive elements $CR_1$ to $CR_N$, it will be understood that in other embodiments common mode calibration circuitry 216 may additionally or alternatively include other types of impedance elements (e.g., such as selectable parallel or series capacitance elements, varactor/s, selectable parallel or series inductance elements, etc.) that may be programmed to achieve other types of variable impedance adjustment.

Table 1 illustrates exemplary resistance values for parallel resistive elements $R_3$ and $CR_1$ to $CR_N$ as they may be selected in one exemplary embodiment for each of positive and negative signal paths of integrated common mode calibration circuitry 216. In the exemplary embodiment of Table 1, one fixed parallel resistance element $R_3$ is provided for each signal path that is not removable from the given signal path, and six selectable resistance elements $CR_1$ to $CR_6$ are provided for each signal path that may be selectively inserted or removed from the given signal paths, e.g., by a corresponding switch $CS_1$ to $S_6$ as shown in FIG. 3. However, it will be understood that the number of selectable resistive elements CR that are provided in a given positive or negative signal path may vary from a single selectable resistive element to many selectable resistive elements, e.g., more than six selectable resistive elements.

TABLE 1

| Resistive Element in Each Signal Path | Resistance Value (Ohms) | Resistor Type |
|---|---|---|
| $R_3$ | 100 | Fixed |
| $CR_1$ | 9900 | Selectable with Switch $CS_1$ |
| $CR_2$ | 4900 | Selectable with Switch $CS_2$ |
| $CR_3$ | 2400 | Selectable with Switch $CS_3$ |
| $CR_4$ | 1150 | Selectable with Switch $CS_4$ |
| $CR_5$ | 809 | Selectable with Switch $CS_5$ |
| $CR_N = CR_6$ | 525 | Selectable with Switch $CS_N = S_6$ |

In the exemplary embodiment of Table 1, a fixed resistor $R_3$ is present in each signal path of calibration circuitry 216 to provide a baseline maximum resistance of 100 Ohms for each of the positive and negative signal paths, i.e., this condition occurs when all resistor control switches $CS_1$ to $CS_6$ are open so as to isolate all selectable resistors $CR_1$ to $CR_6$ from each signal path. Resistance of calibration circuitry within each signal path may be selectively reduced below 100 Ohms by closing one or more of switches $CS_1$ to $CS_6$ so as to insert any selected combination of respective resistors $CR_1$ to $CR_6$ in parallel with fixed resistive element $R_3$ so as to achieve a desired calibration circuitry resistance for either or both of positive and negative signal paths of circuitry 200. For example, inserting one or more of the selectable resistive elements into a first one of the signal paths acts to reduce the calibration circuitry resistance in the first signal path to below 100 Ohms (i.e., by an amount based on the number and identity of inserted the resistors). At the same time, no selectable resistive elements may be inserted into the second one of the signal paths to leave the calibration circuitry resistance in the second signal path at 100 Ohms. In the particular exemplary embodiment of Table 1, the total number and resistance values of the resistive elements provided for each of the positive and negative signal paths has been selected so as to allow each of the positive and negative signal paths to be selectively reduced in 1 Ohm increments from the baseline resistance of 100 Ohms (e.g., to achieve resulting resistance values of 99, 98, 97, etc.). down to a minimum resistance of about 68 as shown in Table 2.

TABLE 2

| Desired Resistance (Ohms) | Actual Resistance (Ohms) |
|---|---|
| 99.0 | 99.0 |
| 98.0 | 98.0 |
| 97.0 | 97.0 |
| 96.0 | 96.0 |
| 95.0 | 95.1 |
| 94.0 | 94.2 |
| 93.0 | 93.3 |
| 92.0 | 92.0 |
| . | . |
| . | . |
| . | . |
| 73.0 | 73.2 |
| 72.0 | 72.1 |
| 71.0 | 70.9 |
| 70.0 | 69.9 |
| 69.0 | 68.8 |
| 68.0 | 67.9 |
| 67.0 | 67.9 |
| 66.0 | 67.9 |

Figure 4:
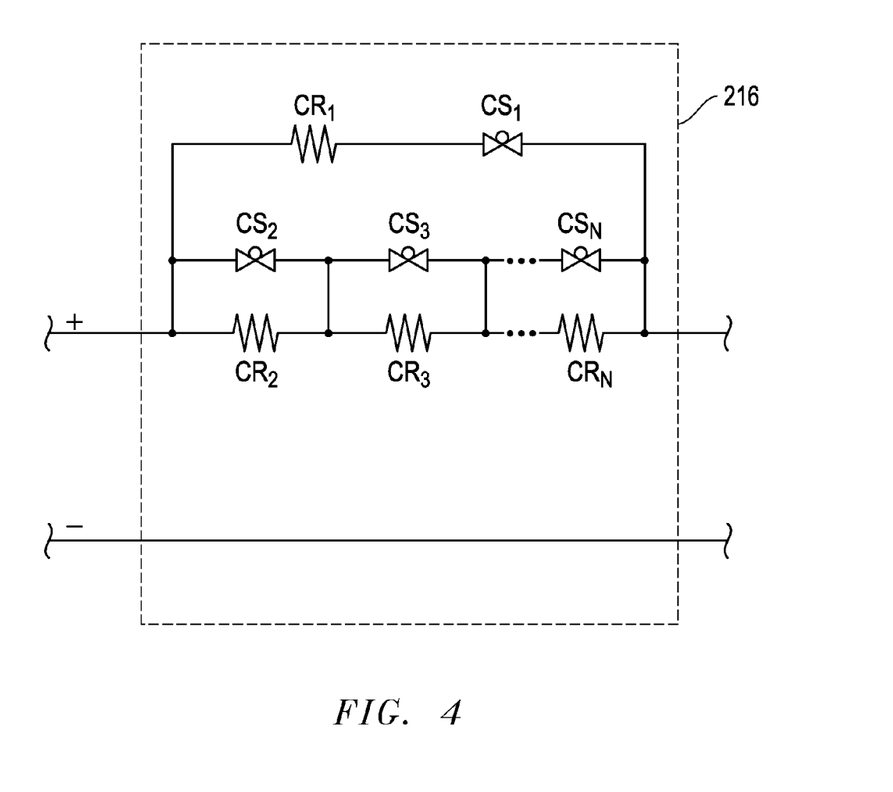
FIG. 4 illustrates integrated common mode calibration circuitry according to one exemplary embodiment of the disclosed circuitry and methods.

It will be understood that exemplary embodiment of FIG. 3 (as well as the number and particular combination of fixed and selectable resistive element values of Table 1, are exemplary only) and that any other number and/or resistive element values may be provided as needed or desired to fit the characteristics of a given circuit application. For example, FIG. 4 illustrates one example alternate embodiment of integrated common mode calibration circuitry 216, which includes a selectable resistive element $CR_1$ and corresponding resistor control switch $CS_1$ that is provided in parallel to selectable series resistive elements $CR_2$ to $CR_N$ which may be selectably and individually inserted and removed from the positive signal path by closing and opening switches $CS_2$ to $CS_N$, respectively. As shown, no selectable resistive elements are provided in the negative signal path in this exemplary embodiment, although it is possible that a similar set of selectable resistive elements $CR_1$ to $CR_N$ and corresponding switches $CS_1$ to $CS_N$ (or alternatively a different configuration of one or more selectable resistive elements and corresponding resistor control switches) may also be provided in the negative signal path in an alternative embodiment. It is also possible that one or more fixed resistive elements may be provided without selectable resistive elements and corresponding resistor control switches in the negative signal path of circuitry 216, or alternatively in combination with selectable resistive elements and corresponding resistor control switches in the negative signal path of circuitry 216. Thus, it will be understood that any combination and/or number of selectable resistive elements may be provided in either one of or both of positive and negative signal paths (together with optional fixed resistive elements in either one of or both of positive and negative signal paths) that is suitable for varying the resistance of the positive and negative signal paths relative to each other in order to at least partially calibrate out resistive mismatches between the positive and negative signal paths. As with the embodiment of FIG. 2, each of selectable switches of the embodiment of FIG. 4 may be controlled by on-chip microcontroller 260 or by one or more other suitable internal or external processing device and/or other control circuitry.

It will also be understood that in the practice of the disclosed circuits and methods, a given resistive element of any of the circuitry described herein may include a circuit element that provides resistance to the circuit or that acts as a resistor during circuit operations, or any combination of multiple circuit elements that together provide resistance to the circuit or that together act as a resistor during circuit operations. For example, a resistive element may itself be a single resistor, a combination of parallel or series resistors, etc. Moreover, it will be understood that the switching elements of any of the circuitry described herein may be implemented using any suitable switch circuit device or combination of switch circuit devices, e.g., such as PMOS and/or NMOS transistors.

Returning to FIG. 2, differential signal circuitry 200 may be provided with optional internal common mode calibration signal circuitry 294 in one exemplary embodiment. As shown, internal common mode calibration signal circuitry 294 may include a calibration signal (e.g., voltage and/or sinusoidal wave-generating) source 290 that may be operated (e.g., in response to control signal from microcontroller 260) to supply a simultaneous common mode calibration signal to each of positive and negative signal paths of differential signal circuitry 200. As further shown, internal common mode calibration signal circuitry 294 may be further configured to optionally isolate each of positive and negative signal paths of differential signal circuitry 200 from any external signals applied to pads 203 and 205 while it is supplying the common mode calibration signal. As will be described further herein, this internal calibration signal may be used together with common mode calibration circuitry 216 to calibrate out any internal resistive mismatch (or other impedance mismatch such as capacitive mismatch, inductive mismatch, etc.) between the internal positive and negative signal paths within differential circuitry 200 from the point of introduction of internal calibration signal from calibration signal source 372 (e.g., at nodes 393 and 395) to the ADC 214, e.g., by measuring the peak differential amplifier output while sweeping through all resistance (e.g., and/or capacitance/inductance) settings of calibration circuitry 216 until the peak value is minimized or the minimum peak value is identified.

FIG. 3 illustrates one exemplary embodiment of integrated internal common mode calibration signal circuitry 294 as it may implemented within integrated differential signal circuitry 200 to selectively supply an internal calibration signal to positive and negative signal paths of integrated differential signal circuitry 200. In this exemplary embodiment, calibration signal source 290 may be selectively coupled to, and isolated from, each of the internal positive and negative signal paths of integrated differential signal circuitry 200 by switching elements $S_{A2}$ as shown, although any other suitable combination of one or more switching elements may be employed. In this embodiment, input multiplexer switching elements $S_1$ may be opened to isolate each of internal positive and negative signal paths from any external signals of input sources 204 during internal calibration testing, although any other suitable circuitry configuration may be employed to isolate each of internal positive and negative signal paths during internal calibration.

Also illustrated in FIG. 3 is optional external (non-integrated) common mode calibration signal circuitry 370 that may be optionally and temporarily coupled to supply an external common mode calibration signal (e.g., a 1 kHz tone) to shorted positive and negative signal paths of integrated differential signal circuitry 200 via positive and negative signal input pads 203 and 205 of a given input source 204, e.g., using switching elements $S_{A1}$ and $S_{B1}$ as shown in similar manner as witching elements $S_{A2}$ and $S_{B2}$, although any other suitable combination of one or more switching elements may be employed. In the illustrated embodiment, external common mode calibration signal circuitry 370 includes a common mode calibration signal (e.g., voltage and/or sinusoidal wave generating) source 372. It will be understood that external common mode calibration signal circuitry 370 may be selectively coupled at any suitable matching locations of external positive and negative signal paths to allow calibration circuitry 216 to be used to calibrate out any combined external and internal resistive mismatch (or other impedance mismatch such as capacitive mismatch, inductance mismatch, etc.) between the positive and negative signal paths from the point of introduction of the external calibration signal from calibration signal source 370 (e.g., at nodes 397 and 399) to the ADC 214, e.g., by measuring the peak differential amplifier output while sweeping through all resistance (e.g., and/or capacitance/inductance) settings of calibration circuitry 216 until the peak value is minimized or the minimum peak value is identified.

For example, optional external differential signal circuitry 374 having external positive signal path 377 and external negative signal path 379 may be coupled to the positive and negative signal input pads 203 and 205 of a given input source 204 of circuitry 200 as shown. Examples of external differential circuitry 374 that may create a resistive mismatch include, but are not limited to, resistive voltage divider circuitry provided to reduce differential signal input voltage for high voltage signal sources (e.g., such as shown in FIG. 3), a series resistor/s provided in only one of the positive or negative signal paths to protect electrostatic discharge (ESD) clamp circuitry, mismatched resistors in the positive and negative signal paths, parallel sections of positive and negative signal lines having different length relative to each other, etc. It will be understood that in one embodiment, multiple different external differential circuits 374 may be selectively coupled to provide a differential pair to integrated differential signal circuitry 200 a unique and that a different external resistive mismatch may exist between the external positive signal path 377 and external negative signal path 379 of each particular configuration of external differential circuitry 374, such that the external resistive mismatch between the external positive and negative signal paths 377 and 379 must be calibrated out by a different and unique setting of variable resistance of calibration circuitry 216 using external common mode calibration signal circuitry 370.

Figure 5:
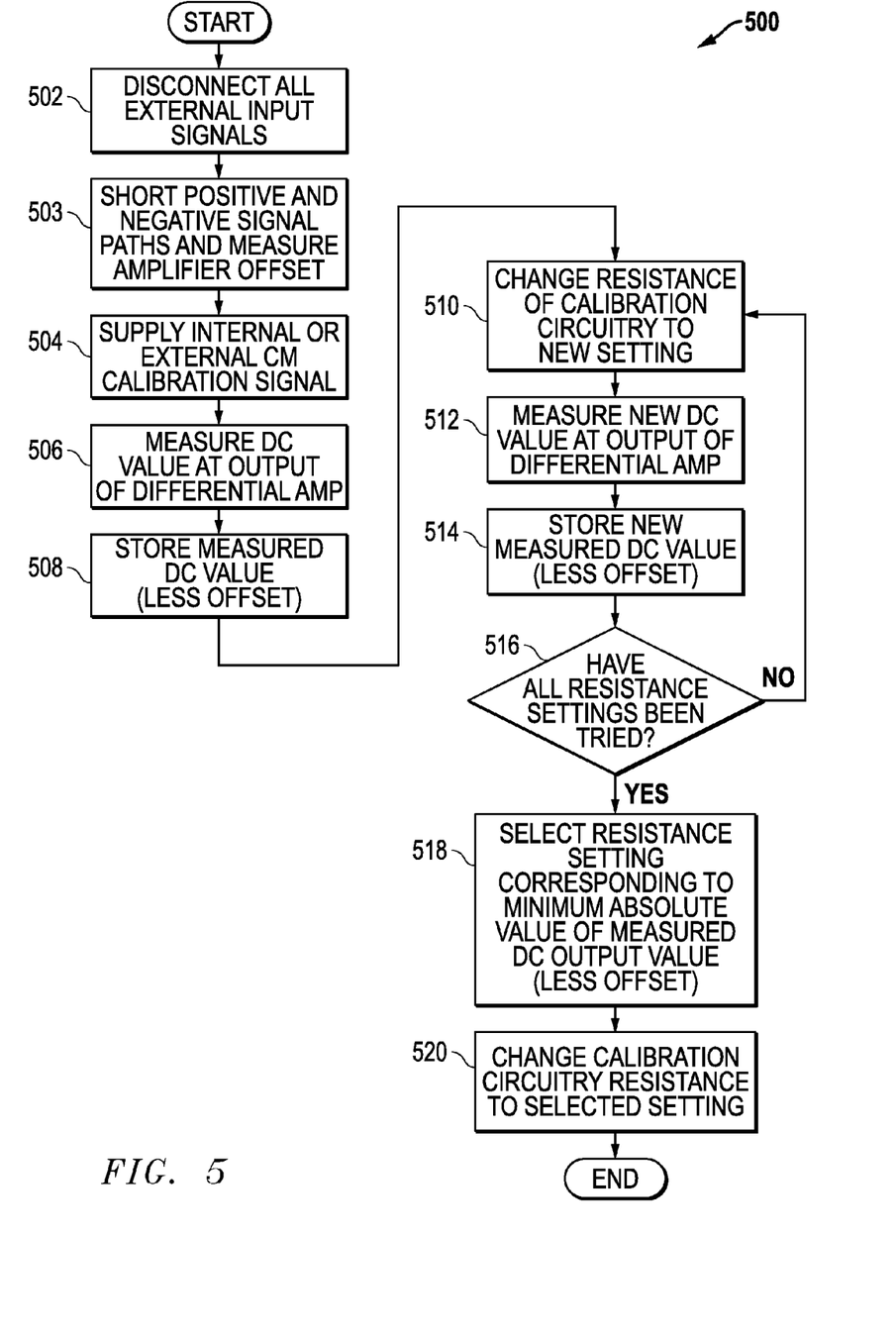
FIG. 5 illustrates methodology according to one exemplary embodiment of the disclosed circuitry and methods.

Still referring to the embodiment of FIG. 3, any internal and/or external resistive mismatch between the positive and negative signal paths of integrated differential signal circuitry 200 may be calibrated out in one exemplary embodiment by the steps of methodology 500 of FIG. 5, e.g., under the control of microcontroller 260 or other suitable processing device. In one embodiment, such a calibration procedure may be initiated automatically, e.g., by microcontroller 260 upon each power up of a system such as radio tuner that includes circuitry 200. Alternatively, such a calibration procedure may be initiated upon receipt of a command from an end-user, during integrated chip testing or system fabrication, etc. In yet another embodiment, a calibration procedure may be initiated every time a different input source 204 is selected for input, a different gain setting is selected for the PGA 220, etc. It will be understood that a similar methodology as FIG. 5 may be employed additionally or alternatively to at least partially calibrate out any other type of internal and/or external impedance mismatch (e.g., capacitive and/or inductive mismatch) between the positive and negative signal paths of integrated differential signal circuitry 200 using suitably configured calibration circuitry 216.

First, in step 502 multiplexer circuitry 202 is controlled to disconnect all external input signals 204 from the positive and negative inputs of differential signal circuitry 200, e.g., by opening all input switching elements $S_1$. Next in optional step 503, the positive and negative signal lines of circuitry 200 may be shorted by closing switching elements $S_{A2}$ with switching element $S_{B2}$ open to isolate calibration signal source 290 from the shorted signal paths, and the voltage offset ($O_0$) of differential amplifier 206 may be measured and stored so that it can be subtracted from later measured DC values that result from resistive mismatches between positive and negative signal lines of circuitry 200. In one exemplary embodiment, the offset ($O_0$) of differential amplifier 206 may be separately removed or subtracted at the output of differential PGA circuitry 220 by ADC 214 and is therefore not considered when using variable resistance of calibration circuitry 216 to calibrate out resistive mismatches in later steps.

Next, in step 504 each of calibration circuitry switching elements $S_{A2}$ and $S_{B2}$ are closed, and calibration source 290 controlled to supply a common mode calibration signal simultaneously to each of positive and negative signal paths with common mode calibration circuitry 216 placed in an initial resistance setting. Such an initial resistance setting may be, for example, with all switching elements $CS_1$ to $CS_N$ open in each of positive and negative signal paths such that no additional resistance is coupled in parallel to resistive element $R_3$ during step 504. However, any other initial resistance setting may be arbitrarily or otherwise chosen by closing one or more of switches $CS_1$ to $CS_N$ in either of the positive and negative signal paths. In methodology 500, a common mode calibration signal may be of any minimum or greater magnitude that is suitable for measurement at the output of differential amplifier 206 when a resistive mismatch is present between the positive and negative signal paths of circuitry 200. For example, in one exemplary embodiment, calibration source 290 may provide a calibration signal that is substantially equal to the maximum allowable common mode voltage that differential amplifier 206 is capable of handling.

After step 504, any resistive mismatch/es that is present between the positive and negative internal signal paths of circuitry 200 at the initial resistance setting of common mode calibration circuitry 216 will degrade the ability of differential amplifier 206 to reject the common-mode signal, resulting in a DC voltage error at the output of differential amplifier 206 that relative to the magnitude of the mismatch. This output DC voltage may be measured in real time during step 506 by ADC 214, or using other suitable signal measurement circuitry and/or technique. In step 508, the optional measured amplifier offset ($O_O$) value from step 503 may be subtracted from the measured output DC value of step 506, and the resulting value recorded or stored in step 508, e.g., in non-volatile and/or volatile memory 261 that is accessible by microcontroller 260. In some embodiments, the calibration codes/values for common mode calibration circuitry 216 (e.g., FIG. 2) may be stored and held in volatile memory, e.g., such as in those embodiments where methodology 500 is performed at every system start up.

Next, in step 510, the resistance setting of common mode calibration circuitry 216 may be changed to a new and different setting by altering the condition of at least one of switching elements $CS_1$ to $CS_N$ in a least one of the positive or negative signal paths from its initial setting used in step 506, i.e., to produce a change in relative resistance between the positive and negative signal paths from that present in step 506. The resulting new value of output DC voltage may then be measured in real time (e.g., by ADC 214) during step 512, and recorded or stored in step 514 in either its actual measured form or after amplifier offset ($O_O$) value of optional step 503 has been subtracted. As shown in step 516, steps 510 to 514 repeat until all possible relative resistance settings of common mode calibration circuitry 216 between the positive and negative signal paths have been tried (i.e., swept through) and their corresponding output DC voltage measured and recorded or stored. Then in step 518, the stored resistance settings of common mode calibration circuitry 216 are compared, and the particular resistance setting of common mode calibration circuitry 216 that resulted in the minimum absolute value of measured DC voltage (less amplifier offset ($O_O$) value) at the output of differential amplifier 206 is selected for use. Then, in step 520 common mode calibration circuitry 216 is returned to (or left unchanged at) the resistance setting that resulted in the minimum measured DC voltage at the output of differential amplifier 206, e.g., by altering the condition of one or more of switching elements $CS_1$ to $CS_N$ as needed. At this point, calibration methodology 500 terminates, e.g., until circuitry power down and re-power up, until another calibration run is requested by a user, etc. In one exemplary embodiment, the last resistance setting of common mode calibration circuitry 216 may be stored in non-volatile memory during system power off conditions, and then retrieved from non-volatile memory and used on the next system start up.

It will be understood that the particular steps (and particular order of steps) of methodology 500 is exemplary only, and that any other combination of fewer, additional, and/or alternative steps may be employed that is suitable for use with common mode calibration circuitry 216 to calibrate out (i.e., reduce or substantially eliminate) differences or mismatches between the signal path resistance of the differential positive and negative signal paths of differential signal circuitry 200. For example, in one alternative embodiment, output DC voltage of differential amplifier 206 may be measured at each of the available different resistance settings of common mode calibration circuitry 216 until all settings have been measured, and then common mode calibration circuitry 216 may be set at the resistance setting that resulted in the minimum measured DC voltage without requiring storage of any measured values in memory.

It will also be understood that a methodology similar to that of FIG. 5 may be employed using external common mode calibration signal circuitry 370 of FIG. 3 (e.g., to supply an external common mode calibration signal in step 504) together with common mode calibration circuitry 216 to calibrate out resistive mismatches present in the external and internal positive and negative signal paths (including any resistive mismatches between external positive and negative signal paths in external circuitry 374) between the external calibration signal circuitry 370 and differential amplifier 206 through a given signal input 204. In such an alternative embodiment, it is not necessary that internal common mode calibration signal circuitry 294 be present, however circuitry configured to selectively short positive and negative paths (e.g., such as integrated switching elements $S_{A2}$) may be optionally provided if amplifier offset is to be measured and factored in the calibration process, e.g., such as described with respect to steps 503 and 518 of FIG. 5 Although a common mode rejection calibration procedure using external common mode calibration signal circuitry 370 may be performed at any time (including by an end-user), in one embodiment external common mode calibration signal circuitry 370 may be used to calibrate out resistive mismatches present in the external and internal positive and negative signal paths during production, e.g., at time of circuit or system fabrication or system assembly.

In one exemplary embodiment, different resistance settings for common mode calibration circuitry 216 that are selected in step 518 of FIG. 5 for different corresponding external circuit configurations and/or different circuit conditions may be stored in a lookup table or other suitable data form in memory 261 for later retrieval and use each time a particular corresponding external circuit configuration is selected and/or a particular circuit condition is encountered, e.g., without requiring a repeat performance of calibration methodology 500.

It will also be understood that one or more of the tasks, functions, or methodologies described herein (e.g., for microcontroller 260) may be implemented, for example, as firmware or other computer program of instructions embodied in a non-transitory tangible computer readable medium that is executed by one or more processing devices such as CPU, controller, microcontroller, processor, microprocessor, FPGA, ASIC, or other suitable processing devices.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed systems and methods may be utilized in various combinations and/or independently. Thus the invention is not limited to only those combinations shown herein, but rather may include other combinations.

What is claimed is:

1. Differential signal circuitry having at least one differential input source configured to receive positive and negative signal components of an analog differential signal pair, the differential circuitry comprising:
   a differential amplifier having a positive input coupled to receive the positive signal of the analog differential signal pair across a positive signal path from the differential input source, and a negative input coupled to receive the negative signal of the analog differential signal pair across a negative signal path from the differential input source; and
   common mode calibration circuitry coupled within at least one of the positive signal path or negative signal path between the differential input source and the inputs of the differential amplifier, the common mode calibration circuitry being configured to programmably vary the impedance of at least one of the positive signal path or negative signal path when a difference exists between an impedance of the positive signal path and an impedance of the negative signal path so as to reduce the existing difference in signal path impedance between the positive and negative signal paths.

2. The circuitry of claim 1, where the common mode calibration circuitry is coupled within each of the positive signal path or negative signal path between the input of the differential signal circuitry input and the input of the differential amplifier, the common mode calibration circuitry being configured to programmably vary the resistance of each of the positive signal path and negative signal path when a difference exists between a resistance of the positive signal path and a resistance of the negative signal path so as to reduce the existing difference in signal path resistance between the positive and negative signal paths.

3. The circuitry of claim 1, where the differential signal circuitry is integrated on a single semiconductor chip; where the positive signal path includes an internal positive signal path of the integrated differential signal circuitry; and where the negative signal path includes an internal negative signal path of the integrated differential signal circuitry.

4. The circuitry of claim 3, where the integrated differential signal circuitry further comprises integrated common mode calibration signal circuitry coupled to the internal positive and negative signal paths with the common mode calibration circuitry between the common mode calibration signal circuitry and the differential amplifier, the common mode calibration signal circuitry being configured to selectively provide a common mode calibration signal simultaneously to each of the internal positive and negative signal paths while the common mode calibration circuitry programmably varies the resistance of at least one of the positive signal path or negative signal path when a difference exists between a resistance of the positive signal path and a resistance of the negative signal path so as to reduce the existing difference in signal path resistance between the positive and negative signal paths.

5. The circuitry of claim 3, further comprising analog to digital conversion (ADC) circuitry; where the differential amplifier has a positive signal output coupled to provide an amplified positive signal of the differential signal to a positive signal input of the ADC circuitry and a negative signal output coupled to provide an amplified negative signal of the differential signal to a negative signal input of the ADC; and where the ADC circuitry is configured to measure a common mode output value of the differential amplifier as the common mode calibration circuitry programmably varies the resistance of at least one of the positive signal path or negative signal path.

6. The circuitry of claim 5, where the integrated differential signal circuitry further comprises:
   one or more switching elements configured to selectively short the internal positive and negative signal paths together; and
   one or more switching elements coupled to isolate the differential input source from each of the positive and negative inputs of the differential amplifier to allow a voltage offset of the differential amplifier to be measured by the ADC circuitry while the internal positive and negative signal paths are shorted together.

7. The circuitry of claim 4, where the analog differential signal pair is an analog audio differential signal pair.

8. Differential signal circuitry having at least one differential input source configured to receive positive and negative signal components of an analog differential signal pair, the differential circuitry comprising:
   a differential amplifier having a positive input coupled to receive the positive signal of the analog differential signal pair across a positive signal path from the differential input source, and a negative input coupled to receive the negative signal of the analog differential signal pair across a negative signal path from the differential input source; and
   common mode calibration circuitry coupled within at least one of the positive signal path or negative signal path between the differential input source and the inputs of the differential amplifier, the common mode calibration circuitry being configured to programmably vary the impedance of at least one of the positive signal path or negative signal path to reduce any difference in signal path impedance between the positive and negative signal paths;
   where the common mode calibration circuitry comprises:
      a first set of multiple resistive elements and a first set of switching elements, each of the first set of multiple resistive elements being configured to be individually and selectively connected and disconnected within the positive signal path by at least one of the switching elements of the first set of switching elements to alter the electrical resistance of the positive signal path between the differential input source and the positive input of the differential amplifier; and
      a second set of multiple resistive elements and a second set of switching elements, each of the second set of multiple resistive elements being configured to be individually and selectively connected and disconnected within the negative signal path by at least one of the switching elements of the second set of switching elements to alter the electrical resistance of the negative signal path between the differential input source and the negative input of the differential amplifier.

9. The circuitry of claim 8, further comprising at least one processing device configured to selectively and individually open and close each of the switching devices of the first and second sets of switching elements of the common mode calibration circuitry to vary the resistance of at least one of the positive signal path or negative signal path to reduce any difference in signal path resistance between the positive and negative signal paths.

10. The circuitry of claim 9, further comprising:
   storage memory circuitry coupled to the at least one processing device; and
   analog to digital conversion (ADC) circuitry having a positive signal input and a negative signal input, the differential amplifier having a positive signal output coupled to provide an amplified positive signal component to the positive signal input of the ADC circuitry and a negative signal output coupled to provide an amplified negative signal component of the differential signal to the negative signal input of the ADC in response to an internal or external common mode calibration signal received in the common mode calibration circuitry from the positive and negative signal paths of the differential signal circuitry;

where the processing device is coupled to control resistance settings of the common mode calibration circuitry to selectively and individually open and close each of the switching elements of the first and second sets of switching elements of the common mode calibration circuitry to vary the resistance of the positive signal path and resistance of the negative signal path relative to each other;

where the ADC is configured to measure each of multiple common mode output values of the differential amplifier from the amplified positive and negative signals of the differential amplifier corresponding to different resistance settings of the common mode calibration circuitry as the resistance of the positive signal path and resistance of the negative signal path are varied relative to each other;

where the processing device is configured to receive each of the multiple measured common mode output values from the ADC and store each of the measured common mode output values in the storage memory circuitry; and where the processing device is configured to select a resistance setting corresponding to the stored common mode output value having the minimum absolute value of all the stored common mode output values, and to selectively and individually open or close each of the switching elements of the first and second sets of switching elements of the common mode calibration circuitry to implement the selected resistance setting for future use during receipt of the positive and negative signal components of an analog differential signal pair received at the differential input source of the differential signal circuitry.

11. The circuitry of claim 1, further comprising:
multiple differential input sources, each of the differential input sources configured to receive positive and negative signal components of a different respective analog differential signal pair; and
multiplexer circuitry coupled between each of the differential input sources and the common mode calibration circuitry, the multiplexer circuitry being configured to selectively and individually provide the positive and negative signal components of a selected one of the multiple differential input sources to the common mode calibration circuitry and differential amplifier.

12. The circuitry of claim 1, where the common mode calibration circuitry is configured to programmably vary the resistance of at least one of the positive signal path or negative signal path when a difference exists between a resistance of the positive signal path and a resistance of the negative signal path so as to reduce the existing difference in signal path resistance between the positive and negative signal paths.

13. A method of calibrating positive and negative signal paths of differential signal circuitry that includes a differential amplifier having a positive input coupled to receive a positive signal of an analog differential signal pair across a positive signal path from a differential input source, and having a negative input coupled to receive a negative signal of the analog differential signal pair across a negative signal path from the differential input source, the method comprising using common mode calibration circuitry to programmably vary the impedance of at least one of the positive signal path or negative signal path when a difference exists between an impedance of the positive signal path and an impedance of the negative signal path so as to reduce the existing difference in signal path impedance between the positive and negative signal paths.

14. The method of claim 13, further comprising using common mode calibration circuitry to programmably vary the resistance of each of the positive signal path and negative signal path when a difference exists between a resistance of the positive signal path and a resistance of the negative signal path so as to reduce the existing difference in signal path resistance between the positive and negative signal paths.

15. The method of claim 13, where the differential signal circuitry is integrated on a single semiconductor chip; where the positive signal path includes an internal positive signal path of the integrated differential signal circuitry; and where the negative signal path includes an internal negative signal path of the integrated differential signal circuitry.

16. The method of claim 15, further comprising using integrated common mode calibration signal circuitry of the differential signal circuitry to programmably provide a common mode calibration signal simultaneously to each of the internal positive and negative signal paths, while at the same time using the common mode calibration circuitry to programmably vary the resistance of at least one of the positive signal path or negative signal path when a difference exists between a resistance of the positive signal path and a resistance of the negative signal path so as to reduce the existing difference in signal path resistance between the positive and negative signal paths.

17. The method of claim 15, further comprising measuring a voltage offset of the differential amplifier while the internal positive and negative signal paths of the integrated differential signal circuitry are shorted together and isolated from the differential input source.

18. A method of calibrating positive and negative signal paths of differential signal circuitry that includes a differential amplifier having a positive input coupled to receive a positive signal of an analog differential signal pair across a positive signal path from a differential input source, and having a negative input coupled to receive a negative signal of the analog differential signal pair across a negative signal path from the differential input source, the method comprising using common mode calibration circuitry to programmably vary the impedance of at least one of the positive signal path or negative signal path to reduce any difference in signal path impedance between the positive and negative signal paths; and the method further comprising:
using a first set of switching elements of the common mode calibration circuitry to individually and selectively connect and disconnect one or more of a first set of multiple resistive elements to alter the electrical resistance of the positive signal path between the differential input source and the positive input of the differential amplifier; and
using a second set of switching elements of the common mode calibration circuitry to individually and selectively connect and disconnect one or more of a second set of multiple resistive elements to alter the electrical resistance of the negative signal path between the differential input source and the negative input of the differential amplifier.

19. The method of claim 18, further comprising:
controlling resistance settings of the common mode calibration circuitry to selectively and individually open and close each of the switching elements of the first and second sets of switching elements of the common mode calibration circuitry to vary the resistance of the positive signal path and resistance of the negative signal path relative to each other;

measuring each of multiple common mode output values of the differential amplifier from the amplified positive and negative signals of the differential amplifier corresponding to different resistance settings of the common mode calibration circuitry as the resistance of the positive signal path and resistance of the negative signal path are varied relative to each other;

selecting a resistance setting corresponding to the measured common mode output value having the minimum absolute value of all the measured common mode output values; and selectively and individually opening or closing each of the switching elements of the first and second sets of switching elements of the common mode calibration circuitry to implement the selected resistance setting for future use during receipt of the positive and negative signal components of an analog differential signal pair received at the differential input source of the differential signal circuitry.

20. A method of calibrating positive and negative signal paths of differential signal circuitry that includes a differential amplifier having a positive input coupled to receive a positive signal of an analog differential signal pair across a positive signal path from a differential input source, and having a negative input coupled to receive a negative signal of the analog differential signal pair across a negative signal path from the differential input source, the method comprising using common mode calibration circuitry to programmably vary the impedance of at least one of the positive signal path or negative signal path to reduce any difference in signal path impedance between the positive and negative signal paths; and the method further comprising:

selecting one of multiple available external differential input sources that each includes an external positive signal path and an external negative signal path, each of the multiple available external differential input sources having a different resistance mismatch between its respective external positive signal path and the external negative signal path of the input source;

selectively and individually coupling the external positive signal path and external negative signal path of the selected one of the multiple external differential input sources in signal communication with the respective positive signal path and negative signal path of the common mode calibration circuitry and differential amplifier;

applying an external common mode calibration signal simultaneously through each of the external positive and negative signal paths of the selected external differential input source to the respective positive signal path and negative signal path of the common mode calibration circuitry and differential amplifier while at the same time programmably varying the resistance of at least one of the positive signal path or negative signal path of the common mode calibration circuitry to reduce any difference in signal path resistance between the combined external positive and negative signal paths of the selected one of the multiple external differential input sources, common mode calibration circuitry and differential amplifier.

21. The method of claim 13, where the analog differential signal pair is an analog audio differential signal pair.

22. The method of claim 13, further comprising using the common mode calibration circuitry to programmably vary the resistance of at least one of the positive signal path or negative signal path when a difference exists between a resistance of the positive signal path and a resistance of the negative signal path so as to reduce the existing difference in signal path resistance between the positive and negative signal paths.

23. The circuitry of claim 1, where the common mode calibration circuitry is configured to programmably vary the impedance of only one of the positive signal path or negative signal path when a difference exists between an impedance of the positive signal path and an impedance of the negative signal path so as to reduce the existing difference in signal path impedance between the positive and negative signal paths.

24. The circuitry of claim 1, where the common mode calibration circuitry is configured to independently vary the impedance of at least one of the positive signal path or negative signal path relative to the other signal path when a difference exists between an impedance of the positive signal path and an impedance of the negative signal path so as to reduce the existing difference in signal path impedance between the positive and negative signal paths.

25. The method of claim 13, further comprising using the common mode calibration circuitry to programmably vary the impedance of only one of the positive signal path or negative signal path when a difference exists between an impedance of the positive signal path and an impedance of the negative signal path so as to reduce the existing difference in signal path impedance between the positive and negative signal paths.

26. The method of claim 13, further comprising using the common mode calibration circuitry to independently vary the impedance of at least one of the positive signal path or negative signal path relative to the other signal path when a difference exists between an impedance of the positive signal path and an impedance of the negative signal path so as to reduce the existing difference in signal path impedance between the positive and negative signal paths.

* * * * *